US012294361B2

(12) United States Patent
Tsai et al.

(10) Patent No.: US 12,294,361 B2
(45) Date of Patent: May 6, 2025

(54) OUTPUT STAGE OF ETHERNET TRANSMITTER

(71) Applicant: REALTEK SEMICONDUCTOR CORPORATION, Hsinchu (TW)

(72) Inventors: Chien-Hui Tsai, Hsinchu (TW); Hung-Chen Chu, Hsinchu (TW); Yung-Tai Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 3 days.

(21) Appl. No.: 18/074,825

(22) Filed: Dec. 5, 2022

(65) Prior Publication Data

US 2023/0216493 A1 Jul. 6, 2023

(30) Foreign Application Priority Data

Jan. 3, 2022 (TW) .................................. 111100140

(51) Int. Cl.
*H03K 17/693* (2006.01)
*H03H 11/28* (2006.01)
*H03K 17/687* (2006.01)

(52) U.S. Cl.
CPC ........... *H03K 17/693* (2013.01); *H03H 11/28* (2013.01); *H03K 17/6872* (2013.01); *H03K 17/6874* (2013.01)

(58) Field of Classification Search
CPC .. H03K 17/693; H03K 17/6872; H03K 17/68; H03H 11/28
See application file for complete search history.

(56) References Cited

U.S. PATENT DOCUMENTS 6,927,608 B1* 8/2005 Chen .................. H03K 17/6872
327/108
8,487,654 B1* 7/2013 Chen .............. H03K 19/017509
326/82

(Continued)

OTHER PUBLICATIONS

OA letter of a counterpart TW application (appl. No. 111100140) mailed on Jun. 30, 2022.2) Summary of the TW OA letter in regard to the TW counterpart application:(1) Claim(s) 1-3 and 6-8 are rejected under Patent Law Article 22(2) as being unpatentable over reference 1 (U.S. Appl. No. 10/014,846 B2).Claim correspondence between the TW counterpart application and the instant US application:(1) Claims 1-10 in the TW counterpart application correspond to claims 1-9 and 11 in the instant US application, respectively.

*Primary Examiner* — Menatoallah Youssef
*Assistant Examiner* — Colleen J O Toole
(74) *Attorney, Agent, or Firm* — WPAT, PC

(57) ABSTRACT

An output stage of an Ethernet transmitter is provided. The output stage is coupled to a resistor and includes a first output terminal, a second output terminal, a first transistor, and a first transistor group. The resistor is coupled between the first output terminal and the second output terminal. The first transistor has a first source, a first drain, and a first gate, the first source being coupled to a first reference voltage and the first drain being coupled to the second output terminal. The first transistor group is coupled to the first reference voltage and the first output terminal. The first transistor group includes multiple transistors which are connected in parallel, and the magnitude of the current flowing to the first output terminal is related to the number of transistors that are turned on.

20 Claims, 5 Drawing Sheets

(56) References Cited

U.S. PATENT DOCUMENTS

| | | | |
|---|---|---|---|
| 10,014,846 B2* | 7/2018 | Momtaz | H04L 25/0282 |
| 2009/0091357 A1* | 4/2009 | Muniyappa | H03K 19/018528 |
| | | | 327/108 |

* cited by examiner

OUTPUT STAGE OF ETHERNET TRANSMITTER

BACKGROUND OF THE INVENTION

1. Field of the Invention

The present invention generally relates to Ethernet, and, more particularly, to impedance matching of the output stage of an Ethernet transmitter.

2. Description of Related Art

FIG. 1 is a schematic diagram of a conventional Ethernet transmitter circuit. The Ethernet transmitter circuit 120 includes a driving circuit 125, two feedback resistors Rf, and two termination resistors Rs. The feedback resistor Rf is coupled between the output terminal (vop/von) of the driving circuit 125 and the input terminal of the driving circuit 125. The termination resistor Rs is coupled between the output terminal (vop/von) and the output terminal (MDIP/MDIN). The output terminal (MDIP/MDIN) is the output port of a component (e.g., a chip) and is coupled to the load resistor RL, which is located outside the component. The main function of the Ethernet transmitter circuit 120 is to amplify the signal source 110 (e.g., the output signal of an amplifier) and output the amplified signal through the output terminal (MDIP/MDIN).

Due to the process variation, the termination resistors Rs usually need to be corrected. FIG. 2 is a schematic diagram of a conventional termination resistor Rs. The conventional correction method is to provide a plurality of resistor (R0 to Rn)-switch (SW0 to SWn) pairs which are connected in parallel and generate different equivalent resistance values (i.e., the resistance value of the termination resistor Rs) by controlling the switches (SW0 to SWn) to turn on or off. The switches SW0 to SWn in FIG. 2 are embodied by transmission gates, and the signals powb_h, pow_h, tap_h, and tapb_h are the control signals of the transmission gates.

However, the transmission gates are low in withstand voltage (i.e., cannot withstand high voltage) when fabricated by the advanced manufacturing process, so the conventional correction method is not suitable for the advanced manufacturing process. Therefore, there is a need for an Ethernet transmitter circuit that can correct the termination resistor Rs for the advanced manufacturing process.

SUMMARY OF THE INVENTION

In view of the issues of the prior art, an object of the present invention is to provide an output stage of an Ethernet transmitter, so as to make an improvement to the prior art.

According to one aspect of the present invention, an output stage of an Ethernet transmitter is provided. The output stage of the Ethernet transmitter is coupled to a resistor and includes a first output terminal, a second output terminal, a first transistor, and a first transistor group. The resistor is coupled between the first output terminal and the second output terminal. The first transistor has a first source, a first drain, and a first gate. The first source is coupled to a first reference voltage, and the first drain is coupled to the second output terminal. The first transistor group is coupled to the first reference voltage and the first output terminal. The first transistor group includes a plurality of transistors that are connected in parallel, and a magnitude of a current flowing to the first output terminal is related to the number of transistors that are turned on.

According to the present invention, the output stage of the Ethernet transmitter achieves the purpose of correcting the characteristic impedance by adjusting the current. In comparison with the prior art, the present invention is suitable for the advanced manufacturing processes because the correction of the termination resistor does not rely on the serial connection of a transmission gates to a resistor.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an output stage of Ethernet transmitter. On account of that some or all elements of the output stage of Ethernet transmitter could be known, the detail of such elements is omitted provided that such detail has little to do with the features of this disclosure, and that this omission nowhere dissatisfies the specification and enablement requirements.

In the following discussion, each transistor has a first terminal, a second terminal, and a control terminal. When the transistor is used as a switch, the first terminal and the second terminal of the transistor are two ends of the switch, and the control terminal controls the switch to conduct (transistor on) or not to conduct (transistor off). For Metal-Oxide-Semiconductor Field-Effect Transistors (MOSFETs), the first terminal can be one of the source and the drain, the second terminal is the other of the source and the drain, and the control terminal is the gate. For bipolar junction transistors (BJTs), the first terminal can be one of the collector and the emitter, the second terminal is the other of the collector and the emitter, and the control terminal is the base.

Figure 1:
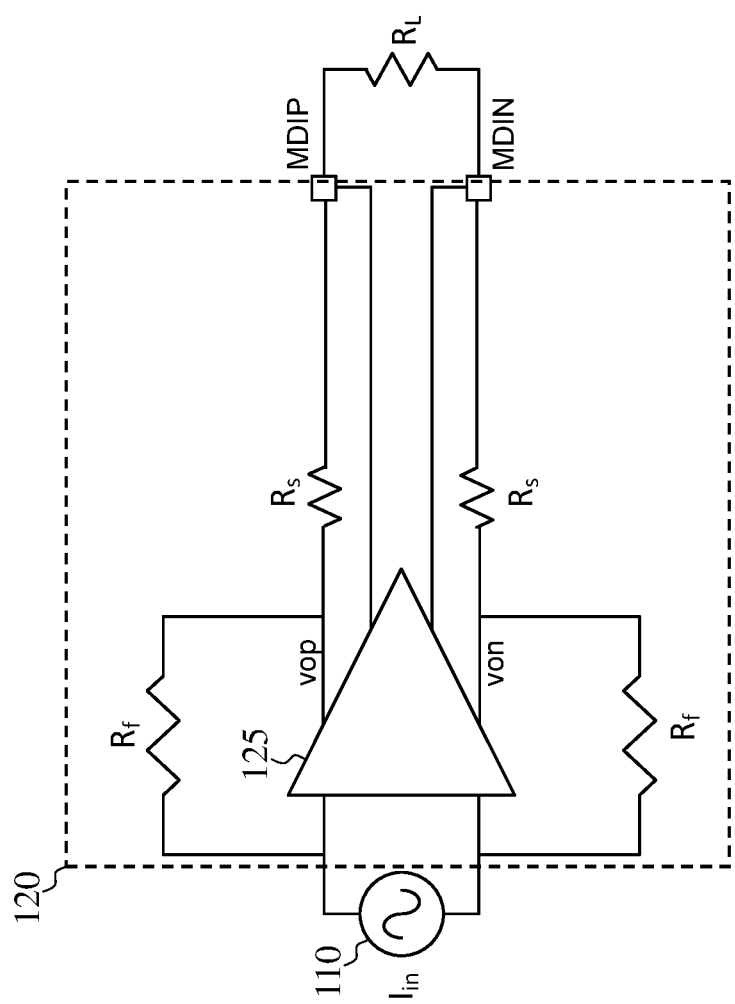
FIG. 1 is a schematic diagram of a conventional Ethernet transmitter circuit.
Figure 3:
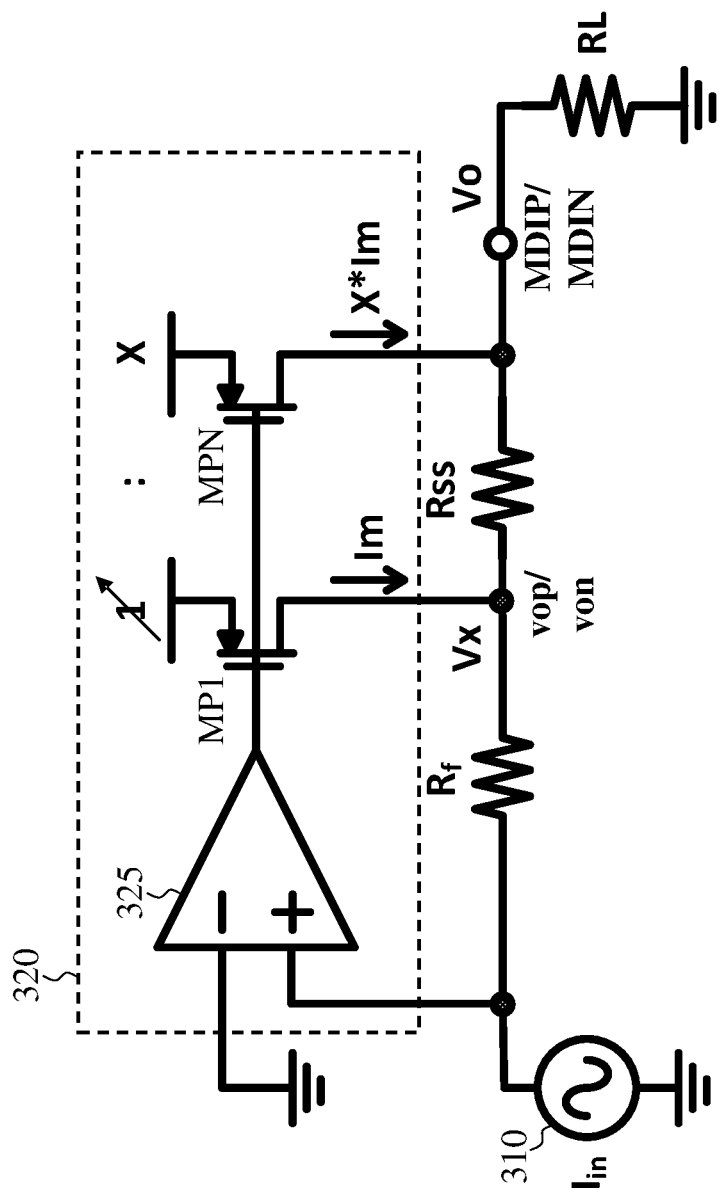
FIG. 3 is a simplified circuit diagram of the output stage of an Ethernet transmitter of the present invention.

Reference is made to FIG. 3, which is a simplified circuit diagram of the Ethernet transmitter circuit of the present invention. For ease of discussion, FIG. 3 is depicted as a single-ended circuit (i.e., corresponding to vop or von in FIG. 1), and the voltage Vx and the voltage Vo are the output voltages of the driving circuit 320. The voltage Vx corresponds to the output terminal vop or von of FIG. 1, and the voltage Vo corresponds to the output terminal MDIP or MDIN of FIG. 1. The driving circuit 320 includes an operational amplifier 325, a transistor group MP1, and a transistor MPN. The transistor group MP1 and the transistor MPN form the output stage of the Ethernet transmitter circuit. One end of the operational amplifier 325 is coupled to the signal source 310. The output current of the transistor group MP1 is Im, and the output current of the transistor MPN is X*Im (i.e., the ratio is 1:X, wherein the arrow on the numeral "1" in FIG. 3 indicates that the current Im is adjustable). The goal of the circuit design is that there is no current on the resistor Rss (i.e., Vx=Vo); as a result, Vo=(Im+X*Im)*RL=(1+X)*Im*RL. Because Vx=Im*(Rss+RL)≅Im*Rss (assuming Rss>>RL), Im*Rss=(1+X)*Im*RL; therefore, Rss=(1+X)*RL. In other words, when observed from the outside, the characteristic impedance or output impedance of the Ethernet transmitter circuit is Rss/(1+X). In the present invention, the resistor Rss is fixed, and the characteristic impedance of the output stage is corrected by adjusting the ratio (1:X). In other words, the resistor Rss is a pure resistor and does not contain any switch; that is, there is no switch (which may be a transistor, a transmission gate, or other components) between the output terminal vop or von and the output terminal MDIP or MDIN.

FIG. 3 shows only single-ended signals; however, the present invention can be applied to differential signals. The circuit for differential signals is discussed below in connection with FIG. 4.

Figure 4:
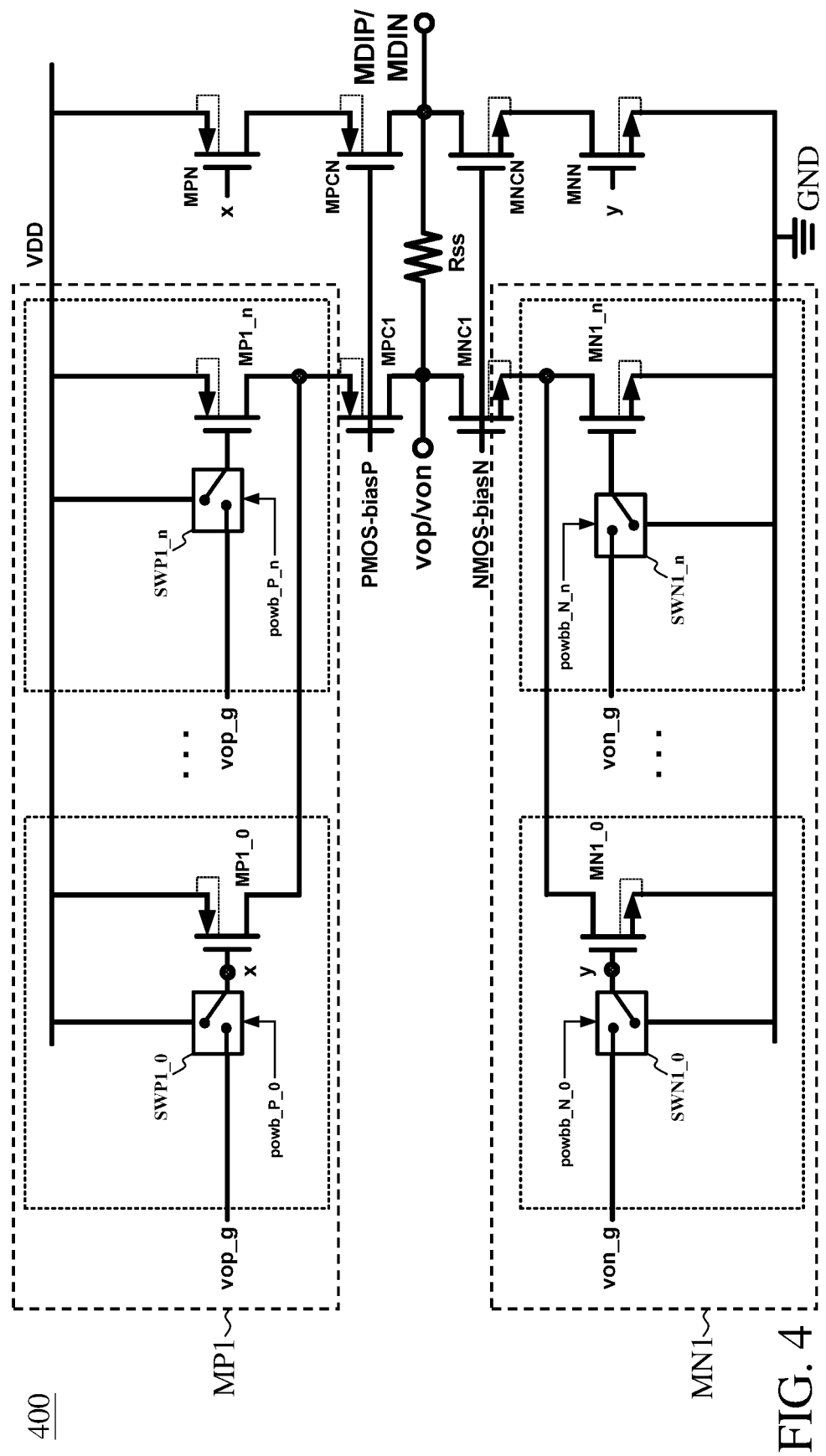
FIG. 4 is a circuit diagram of the output stage of the Ethernet transmitter of the present invention.

Reference is made to FIG. 4, which is a circuit diagram of the output stage of the Ethernet transmitter of the present invention. The output stage 400 includes a transistor MPN, a transistor MNN, a transistor MPCN, a transistor MNCN, a transistor MPC1, a transistor MNC1, a transistor group MP1, and a transistor group MN1. The transistor group MP1 includes a transistor MP1_0, a switch SWP1_0, a transistor MP1_n, and a switch SWP1_n. The transistor group MN1 includes a transistor MN1_0, a switch SWN1_0, a transistor MN1_n, and a switch SWN1_n. The magnitude of the current Im in FIG. 3 is related to the number of transistors that are turned on in the transistor group MP1 and/or the transistor group MN1, which will be detailed below.

It should be noted that, for the sake of brevity and focusing on the present invention, the feedback resistor Rf is omitted in FIG. 4. People having ordinary skill in the art can know from FIG. 3 where to arrange the feedback resistor Rf in the circuit of FIG. 4 (e.g., connected to the output terminal of the digital-to-analog converter DAC (not shown) and the output terminal vop/von).

The source of the transistor MPN is coupled or electrically connected to the first reference voltage (e.g., the power supply voltage VDD); the gate of transistor MPN is coupled or electrically connected to the node x. The source of the transistor MNN is coupled or electrically connected to a second reference voltage (e.g., ground GND, where VDD>GND); the gate of transistor MNN is coupled to the node y. The source of the transistor MPCN is coupled or electrically connected to the drain of the transistor MPN; the drain of the transistor MPCN is coupled or electrically connected to the output terminal MDIP or MDIN; the gate of the transistor MPCN receives the voltage PMOS-biasP. The source of the transistor MNCN is coupled or electrically connected to the drain of the transistor MNN; the drain of the transistor MNCN is coupled or electrically connected to the output terminal MDIP or MDIN; the gate of the transistor MNCN receives the voltage NMOS-biasN. The drain of the transistor MPC1 is coupled or electrically connected to the output terminal vop or von; the gate of the transistor MPC1 receives the voltage PMOS-biasP. The drain of the transistor MNC1 is coupled or electrically connected to the output terminal vop or von; the gate of the transistor MNC1 receives the voltage NMOS-biasN.

The source of the transistor MP1_0 is coupled or electrically connected to the first reference voltage; the drain of the transistor MP1_0 is coupled or electrically connected to the source of the transistor MPC1; the gate of the transistor MP1_0 is coupled or electrically connected to the node x (i.e., the gate of the transistor MPN) and is coupled to the first reference voltage or the signal vop_g through the switch SWP1_0. The switch SWP1_0 is controlled by the control signal powb_P_O.

The source of the transistor MP1_n is coupled or electrically connected to the first reference voltage; the drain of the transistor MP1_n is coupled or electrically connected to the source of the transistor MPC1; the gate of the transistor MP1_n is coupled to the first reference voltage or the signal vop_g through the switch SWP1_n. The switch SWP1_n is controlled by the control signal powb_P_n.

The source of the transistor MN1_0 is coupled or electrically connected to the second reference voltage; the drain of the transistor MN1_0 is coupled or electrically connected to the source of the transistor MNC1; the gate of the transistor MN1_0 is coupled or electrically connected to the node y (i.e., the gate of the transistor MNN) and is coupled to the second reference voltage or the signal von_g through the switch SWN1_0. The switch SWN1_0 is controlled by the control signal powbb_N_0.

The source of the transistor MN1_n is coupled or electrically connected to the second reference voltage; the drain of the transistor MN1_n is coupled or electrically connected to the source of the transistor MNC1; the gate of the transistor MN1_n is coupled to the second reference voltage or the signal von_g through the switch SWN1_n. The switch SWN1_n is controlled by the control signal powbb_N_n.

The aforementioned transistor (MP1_k or MN1_k) and the switch (SWP1_k or SWN1_k) that is coupled or electrically connected to the gate of that transistor together form a switch-transistor pair ($0 \leq k \leq n$), and the output stage 400 includes 2*(n+1) switch-transistor pairs ($n \geq 1$) (i.e., the transistor group MP1 of FIG. 3 includes n+1 transistors (MP1_0 to MP1_n) and n+1 switches (SWP1_0 to SWP1_n), and the transistor group MN1 includes n+1 transistors (MN1_0 to MN1_n) and n+1 switches (SWN1_0 to SWN1_n)). When the switch SWP1_k (or SWN1_k) is switched to the first reference voltage (or the second reference voltage), the transistor MP1_k (or MN1_k) is turned off (not conducting), with its gate receiving the first reference voltage (or the second reference voltage). When the switch SWP1_k (or SWN1_k) is switched to the signal vop_g (or the signal von_g), the transistor MP1_k (or the MN1_k) is turned on (conducting), with its gate receiving the signal vop_g (or the signal von_g). When the number of turned-on transistors is greater (less), the current flowing through the transistor group MP1 is larger (smaller), which is equivalent to the current Im in FIG. 3 being larger (smaller). Therefore, the ratio (1:X) of FIG. 3 can be adjusted by controlling the switches (SWP1_0 to SWP1_n and SWN1_0 to SWN1_n), thereby achieving the purpose of correcting the characteristic impedance Rss/(1+X).

Figure 5:
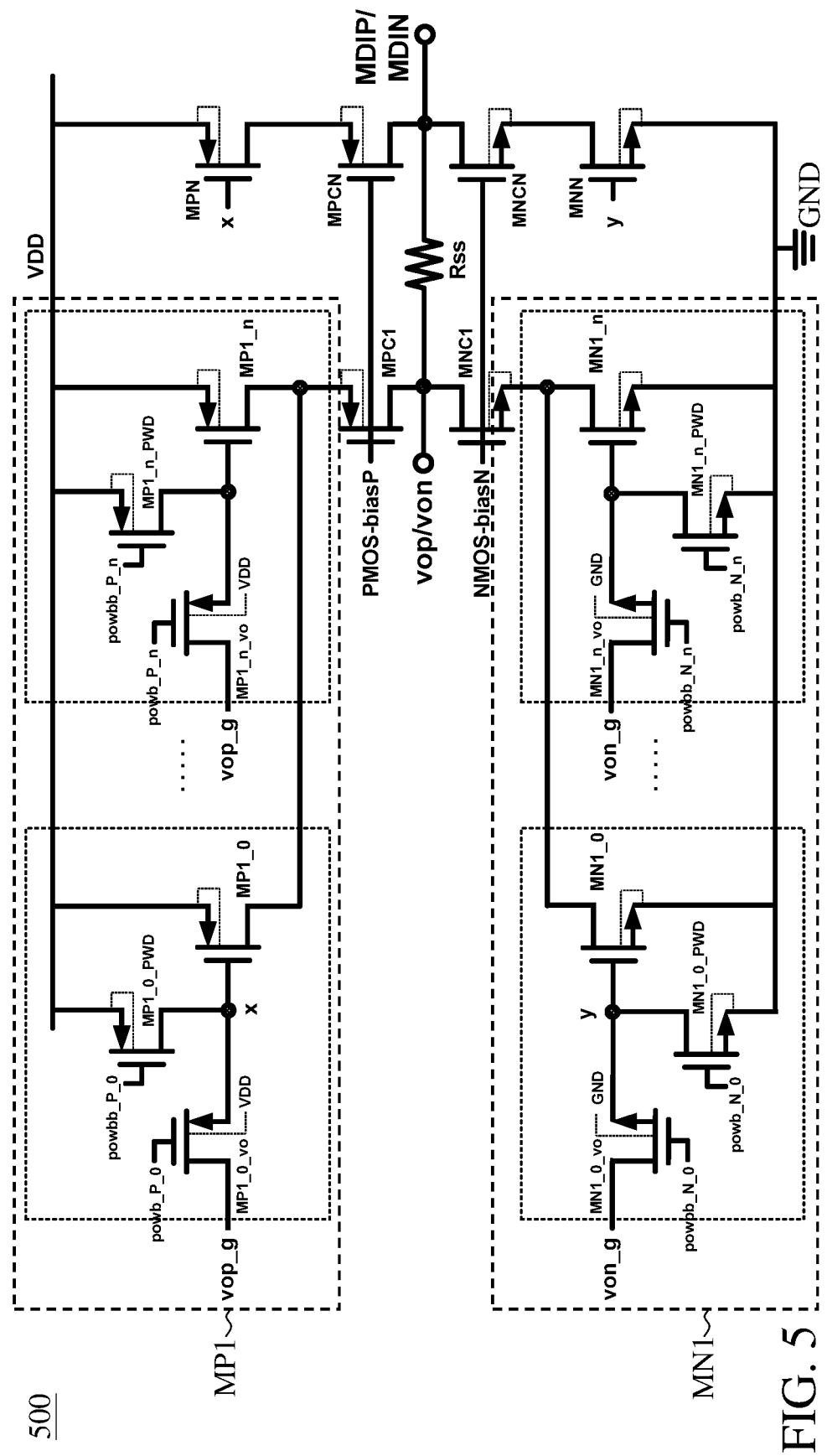
FIG. 5 is a circuit diagram of the output stage of the Ethernet transmitter of the present invention.

Reference is made to FIG. 5, which is a circuit diagram of the output stage of the Ethernet transmitter of the present invention. The output stage 500 is a detailed implementation of the output stage 400. More specifically, FIG. 5 shows the internal circuits of the switches SWP1_k and SWN1_k of FIG. 4. In the example of FIG. 5, the switch SWP1_k (or SWN1_k) includes two transistors. For example, the switch SWP10 includes the transistor MP1_0_vo and the transistor MP1_0_PWD. The source of the transistor MP1_0_vo is coupled or electrically connected to the node x and the gate of the transistor MP1_0; the drain of the transistor MP1_0_vo receives the signal vop_g (i.e., is coupled or electrically connected to the signal source (not shown)); the gate of the transistor MP1_0_vo receives the control signal powb_P_0. The source of the transistor MP1_0_PWD is coupled or electrically connected to the first reference voltage; the drain of the transistor MP1_0_PWD is coupled or electrically connected to the node x and the gate of the transistor MP1_0; the gate of the transistor MP1_0_PWD receives the control signal powbb_P_0. The signal powb_P_0 and the signal powbb_P_0 are each other's inverted signal. When the control signal powb_P_0 is at a high level, the transistor MP1_0_vo is turned off and the transistor MP1_0_PWD is turned on, so that the transistor MP1_0 is turned off (i.e., does not contribute to the current Im). When the control signal powb_P_0 is at a low level, the transistor MP1_0_vo is turned on and the transistor MP1_0_PWD is turned off, so that the transistor MP1_0 is turned on and receives the signal vop_g (i.e., contributes to the current Im). People having ordinary skill in the art can understand the operating principles of other switches based on the above discussions about the switch SWP1_0, and the details are omitted for brevity.

In some embodiments, switches of a pair (i.e., SWP1_k and SWN1_k) are turned on or turned off together. For example, when the gate of the transistor MP1_0 (or MP1_n) receives the first reference voltage, the gate of the transistor MN1_0 (or MN1_n) receives the second reference voltage; when the gate of the transistor MP1_0 (or MP1_n) receives the signal vop_g, the gate of the transistor MN1_0 (or MN1_n) receives the signal von_g.

In some embodiments, the transistors MP1_0 and MN1_0 are always on, while the other transistors (MP1_1 to MP1_n and MN1_1 to MN1_n) are turned on or off according to the demand (i.e., the aforementioned ratio (1:X)).

In practical operations, the user conducts the correction by controlling the control signals (including powb_P_0, . . . powb_P_k, . . . , powb_P_n, powbb_N_0, . . . , powbb_N_k, . . . , powbb_N_n). The control signal powbb_P_n, the control signal powb_N_0, and the control signal powb_N_n are the inverted signals of the control signal powb_P_n, the control signal powbb_N_0, and the control signal powbb_N_n, respectively.

The transistor MPCN, the transistor MNCN, the transistor MPC1 and the transistor MNC1 in FIGS. 4 and 5 are used for protecting other transistors from being subjected to excessive voltages. The voltages PMOS-biasP and NMOS-biasN are the bias voltages of the transistors. In some embodiments, the transistor MPCN, the transistor MNCN, the transistor MPC1, and the transistor MNC1 may be omitted if it can be guaranteed that the other transistors are free from excessive voltages.

It should be noted that the dashed lines on the transistors in FIGS. 4 and 5 represent the bias voltages of the bases of the transistors; however, this is for illustrative purposes only, and the present disclosure is not limited thereto. Other methods of biasing the bases also fall within the scope of the present invention.

Figure 2:
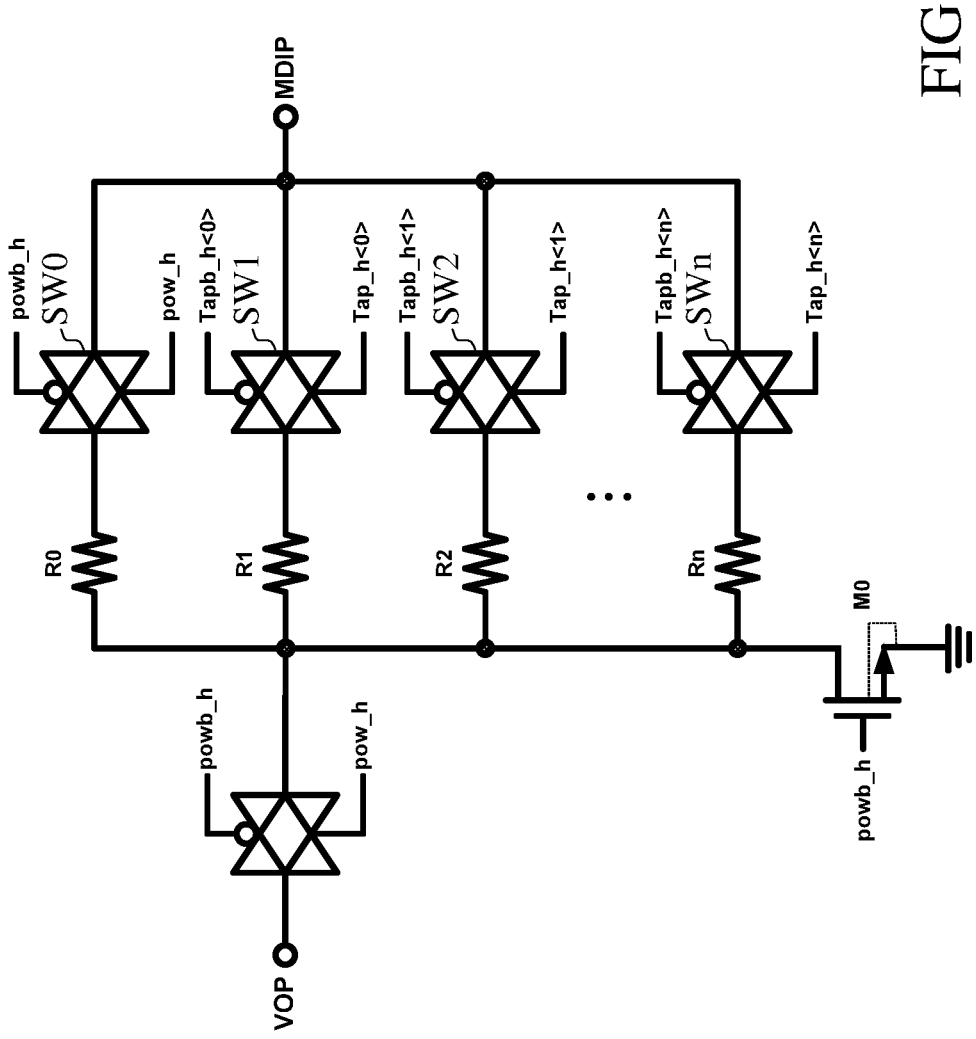
FIG. 2 is a schematic diagram of a conventional termination resistor.

To sum up, the output stage of the Ethernet transmitter of the present invention includes a plurality of transistors connected in parallel, and the output current ratio (i.e., the ratio in FIG. 3 (1:X)) is adjusted by turning on or off the transistors, thereby achieving the purpose of correcting the characteristic impedance. Furthermore, since the present invention does not correct the termination resistor by connecting a resistor in series with a transmission gate (as shown in FIG. 2), the present invention is suitable for the advanced manufacturing processes. Of course, the present invention can also be applied to non-advanced manufacturing processes.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An output stage of an Ethernet transmitter, which is coupled to a resistor, comprising:
   a first output terminal;
   a second output terminal, wherein the resistor is coupled between the first output terminal and the second output terminal;
   a first transistor having a first source, a first drain, and a first gate, wherein the first source is coupled to a first reference voltage, and the first drain is coupled to the second output terminal; and
   a first transistor group coupled to the first reference voltage and the first output terminal;
   wherein the first transistor group comprises a plurality of transistors that are connected in parallel, and a magnitude of a current flowing to the first output terminal is related to the number of transistors that are turned on;
   wherein a first voltage at the first output terminal is substantially equal to a second voltage at the second output terminal so that there is no current on the resistor.

2. The output stage of claim 1, wherein the first transistor group comprises:
   a second transistor having a second source, a second drain, and a second gate, wherein the second source is coupled to the first reference voltage, the second drain is coupled to the first output terminal, and the second gate is coupled to the first gate.

3. The output stage of claim 2, wherein the first transistor group further comprises:
   a third transistor having a third source, a third drain, and a third gate, wherein the third source is coupled to the first reference voltage, and the third drain is coupled to the first output terminal.

4. The output stage of claim 3, wherein the output stage receives a signal, the first transistor group further comprising:
   a first switch which is coupled to the second gate and causes the second gate to receive the first reference voltage or the signal according to a first control signal; and
   a second switch which is coupled to the third gate and causes the third gate to receive the first reference voltage or the signal according to a second control signal.

5. The output stage of claim 4, wherein the first switch and the second switch each comprise:
   a fourth transistor having a fourth source, a fourth drain, and a fourth gate, wherein the fourth source is coupled to the first reference voltage, the fourth drain is coupled to the second gate or the third gate, and the fourth gate receives an inverted signal of the first control signal or an inverted signal of the second control signal; and a fifth transistor having a fifth source, a fifth drain, and a fifth gate, wherein the fifth source is coupled to the second gate or the third gate, the fifth drain receives the signal, and the fifth gate receives the first control signal or the second control signal.

6. The output stage of claim 1 further comprising:

a second transistor having a second source, a second drain, and a second gate, wherein the second source is coupled to a second reference voltage, and the second drain is coupled to the second output terminal; and a second transistor group that is coupled to the second reference voltage and the first output terminal and comprises a plurality of transistors connected in parallel.

7. The output stage of claim 6, wherein the second transistor group comprises:

a third transistor having a third source, a third drain, and a third gate, wherein the third source is coupled to the second reference voltage, the third drain is coupled to the first output terminal, and the third gate is coupled to the second gate.

8. The output stage of claim 7, wherein the second transistor group further comprises:

a fourth transistor having a fourth source, a fourth drain, and a fourth gate, wherein the fourth source is coupled to the second reference voltage, and the fourth drain is coupled to the first output terminal.

9. The output stage of claim 8, wherein the output stage receives a signal, the second transistor group further comprising:

a first switch which is coupled to the third gate and causes the third gate to receive the second reference voltage or the signal according to a first control signal; and a second switch which is coupled to the fourth gate and causes the fourth gate to receive the second reference voltage or the signal according to a second control signal.

10. The output stage of claim 9, wherein the first switch and the second switch each comprise:

a fifth transistor having a fifth source, a fifth drain, and a fifth gate, wherein the fifth source is coupled to the second reference voltage, the fifth drain is coupled to the third gate or the fourth gate, the fifth gate receives an inverted signal of the first control signal or an inverted signal of the second control signal; and a sixth transistor having a sixth source, a sixth drain, and a sixth gate, wherein the sixth source is coupled to the third gate or the fourth gate, the sixth drain receives the signal, and the sixth gate receives the first control signal or the second control signal.

11. The output stage of claim 6 further comprising:

a third transistor having a third source and a third drain, wherein the third source is coupled to the first drain, and the third drain is coupled to the second output terminal;

a fourth transistor having a fourth source and a fourth drain, wherein the fourth source is coupled to the second drain, and the fourth drain is coupled to the second output terminal;

a fifth transistor having a fifth source and a fifth drain, wherein the fifth source is coupled to the first transistor group, and the fifth drain is coupled to the first output terminal; and a sixth transistor having a sixth source and a sixth drain, wherein the sixth source is coupled to the second transistor group, and the sixth drain is coupled to the first output terminal.

12. The output stage of claim 1 further comprising:

a second transistor having a second source and a second drain, wherein the second source is coupled to the first drain, and the second drain is coupled to the second output terminal; and a third transistor having a third source and a third drain, wherein the third source is coupled to the first transistor group, and the third drain is coupled to the first output terminal.

13. The output stage of claim 1, wherein there is no switch between the first output terminal and the second output terminal.

14. An output stage of an Ethernet transmitter, which is coupled to a resistor, comprising:

a first output terminal;

a second output terminal, wherein the resistor is coupled between the first output terminal and the second output terminal;

a first transistor having a first source, a first drain, and a first gate, wherein the first source is coupled to a first reference voltage, and the first drain is coupled to the second output terminal;

a first transistor group coupled to the first reference voltage and the first output terminal;

a second transistor having a second source and a second drain, wherein the second source is direct electrically connected to the first drain, and the second drain is coupled to the second output terminal; and a third transistor having a third source and a third drain, wherein the third source is electrically connected to the first transistor group, and the third drain is coupled to the first output terminal;

wherein the first transistor group comprises a plurality of transistors that are connected in parallel, and a magnitude of a current flowing to the first output terminal is related to the number of transistors that are turned on.

15. The output stage of claim 14, wherein the first transistor group comprises:

a fourth transistor having a fourth source, a fourth drain, and a fourth gate, wherein the fourth source is coupled to the first reference voltage, the fourth drain is coupled to the first output terminal, and the fourth gate is coupled to the first gate.

16. The output stage of claim 15, wherein the first transistor group further comprises:

a fifth transistor having a fifth source, a fifth drain, and a fifth gate, wherein the fifth source is coupled to the first reference voltage, and the fifth drain is coupled to the first output terminal.

17. The output stage of claim 16, wherein the output stage receives a signal, the first transistor group further comprising:

a first switch which is coupled to the fourth gate and causes the fourth gate to receive the first reference voltage or the signal according to a first control signal; and a second switch which is coupled to the fifth gate and causes the fifth gate to receive the first reference voltage or the signal according to a second control signal.

18. The output stage of claim 17, wherein the first switch and the second switch each comprise:

a sixth transistor having a sixth source, a sixth drain, and a sixth gate, wherein the sixth source is coupled to the first reference voltage, the sixth drain is coupled to the fourth gate or the fifth gate, and the sixth gate receives an inverted signal of the first control signal or an inverted signal of the second control signal; and a seventh transistor having a seventh source, a seventh drain, and a seventh gate, wherein the seventh source is coupled to the fourth gate or the fifth gate, the seventh drain receives the signal, and the seventh gate receives the first control signal or the second control signal.

19. The output stage of claim 14 further comprising:

a fourth transistor having a fourth source, a fourth drain, and a fourth gate, wherein the fourth source is coupled to a second reference voltage, and the fourth drain is coupled to the second output terminal; and a second transistor group that is coupled to the second reference voltage and the first output terminal and comprises a plurality of transistors connected in parallel.

20. The output stage of claim 14, wherein a characteristic impedance of the output stage is corrected by adjusting a ratio of an output current of the first transistor group to another output current of the first transistor.

\* \* \* \* \*